United States Patent
Ikehashi

(10) Patent No.: US 7,446,457 B2
(45) Date of Patent: Nov. 4, 2008

(54) SEMICONDUCTOR DEVICE USING PIEZOELECTRIC ACTUATOR FORMED BY USE OF MEMS TECHNIQUE

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 536 days.

(21) Appl. No.: 11/284,091

(22) Filed: Nov. 22, 2005

(65) Prior Publication Data
US 2006/0290236 A1  Dec. 28, 2006

(30) Foreign Application Priority Data
Jun. 24, 2005  (JP)  .............................. 2005-185195

(51) Int. Cl.
*H01L 41/04* (2006.01)
(52) U.S. Cl. .................. 310/330; 310/331; 310/332; 977/712; 977/724; 977/732; 977/837
(58) Field of Classification Search ......... 310/330–332; 977/712, 724, 732, 837
See application file for complete search history.

(56) References Cited

U.S. PATENT DOCUMENTS

| | | | | |
|---|---|---|---|---|
| 5,613,861 | A * | 3/1997 | Smith et al. .................... 439/81 |
| 6,127,908 | A * | 10/2000 | Bozler et al. ................. 333/246 |
| 6,236,491 | B1 * | 5/2001 | Goodwin-Johansson .... 359/291 |
| 6,396,677 | B1 * | 5/2002 | Chua et al. ................... 361/278 |
| 6,456,420 | B1 * | 9/2002 | Goodwin-Johansson .... 359/291 |
| 6,534,249 | B2 * | 3/2003 | Fork et al. ................... 430/322 |
| 6,595,787 | B2 * | 7/2003 | Fork et al. ..................... 439/81 |
| 6,848,175 | B2 * | 2/2005 | Fork et al. ..................... 29/842 |
| 6,933,165 | B2 * | 8/2005 | Musolf et al. .................. 438/50 |
| 7,177,065 | B2 * | 2/2007 | Ishizuya et al. ............. 359/291 |
| 2006/0055287 | A1 * | 3/2006 | Kawakubo et al. .......... 310/348 |
| 2007/0228887 | A1 * | 10/2007 | Nishigaki et al. ........... 310/332 |
| 2008/0042521 | A1 * | 2/2008 | Kawakubo et al. .......... 310/328 |

OTHER PUBLICATIONS

Q. Liu, et al., "Micromachined Variable Capacitors with Laterally Positioned Suspended Plates", Proc. of SPIE, vol. 4601, 2001, pp. 20-24.

H.C. Lee et al., "Silicon Bulk Micromachined RF MEMS Switches with 3.5 Volts Operation by using Piezoelectric Actuator", IEEE MTT-S Digest, 2004, pp. 585-588.

* cited by examiner

*Primary Examiner*—J. A San Martin
(74) *Attorney, Agent, or Firm*—Foley & Lardner LLP

(57) ABSTRACT

A semiconductor device includes beam portions and piezoelectric portions. Each of the beam portions is formed to extend in a first direction with one end fixed at a substrate by use of a supporting member and warped by residual stress with the supporting member set as a starting point. Each of the piezoelectric portions is connected to the other end of the corresponding beam portion and formed to extend in a second direction intersecting with the first direction and moves parallel to the substrate in a first direction and in a direction opposite to the first direction by application of bias voltage.

20 Claims, 14 Drawing Sheets

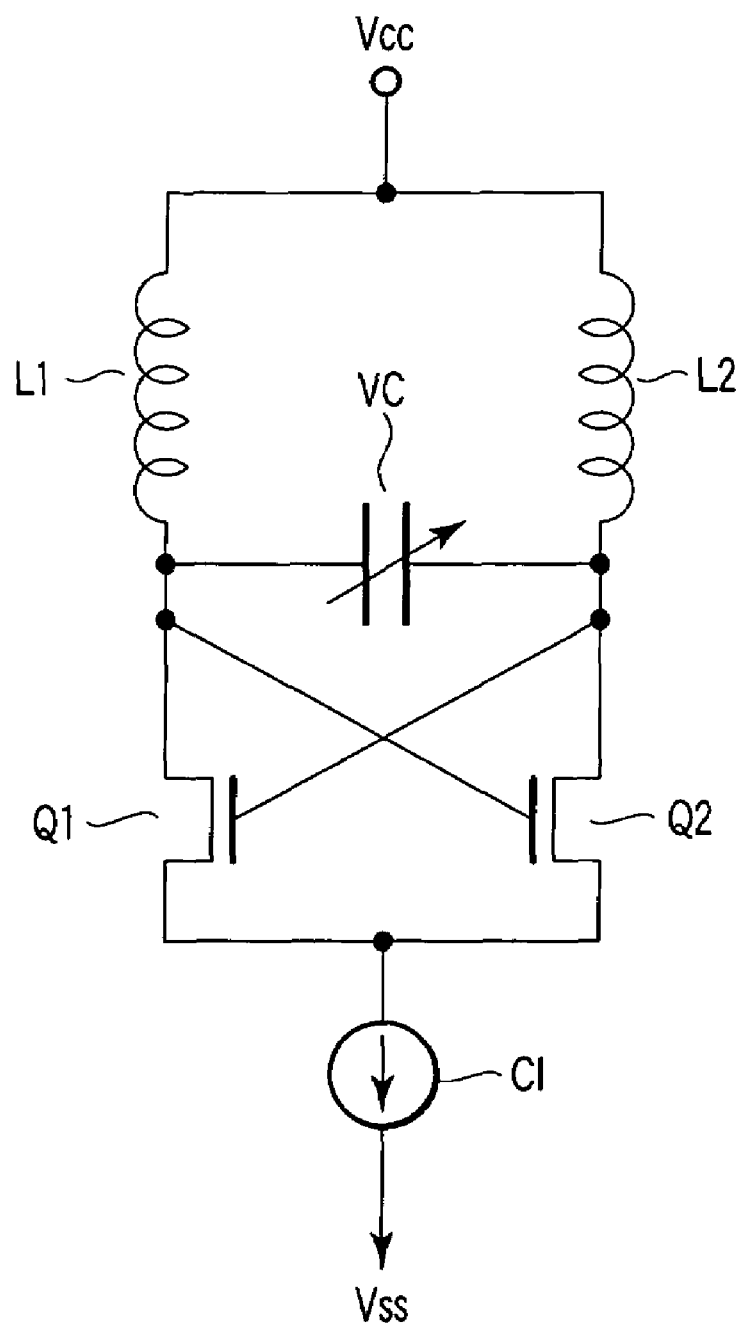
F I G. 16

SEMICONDUCTOR DEVICE USING PIEZOELECTRIC ACTUATOR FORMED BY USE OF MEMS TECHNIQUE

CROSS-REFERENCE TO RELATED APPLICATIONS

This application is based upon and claims the benefit of priority from prior Japanese Patent Application No. 2005-185195, filed Jun. 24, 2005, the entire contents of which are incorporated herein by reference.

BACKGROUND OF THE INVENTION

1. Field of the Invention

This invention relates to a semiconductor device such as a switch, variable capacitor, acceleration sensor, gyroscope, inertia sensor chip and XY stage using a piezoelectric actuator formed by use of a micromachine or micro electro mechanical systems (MEMS) technique.

2. Description of the Related Art

In a driving system of an actuator formed by use of the MEMS technique, electrostatic-, piezoelectric-, thermal- and electromagnetic-type driving systems are provided. The piezoelectric-type driving system among the above systems can perform a driving operation at low voltage with low power consumption, and is suitable for the driving system of an actuator mounted on a mobile telephone. The piezoelectric actuator is used in a switch or variable capacitor, for example.

The switch or variable capacitor used in the piezoelectric actuator is described in, for example, H. C. Lee et al, "Silicon Bulk Micromachined RF MEMS Switches with 3.5 Volts Operation by using Piezoelectric Actuator", MTT-S Digest, pp 585-588, 2004. If the piezoelectric actuator is used as is described in the above paper, a displacement of several microns can be caused to occur in the upper or lower direction by use of a low voltage of approximately 3 V.

However, since the conventional piezoelectric actuator cannot produce large displacement in the lateral direction, applicable devices are limited.

BRIEF SUMMARY OF THE INVENTION

A semiconductor device according to an aspect of this invention comprises a first beam portion which is formed to extend in a first direction with one end fixed at a substrate by use of a first supporting member and warped by residual stress with the first supporting member set as a starting point, and a first piezoelectric portion which is connected to the other end of the first beam portion and formed to extend in a second direction intersecting with the first direction and moves parallel to the substrate in the first direction and in a direction opposite to the first direction by application of first bias voltage.

Further, a semiconductor device according to another aspect of this invention comprises a first electrode, a second electrode arranged in opposition to the first electrode to at least partly overlap the first electrode, a capacitance of a capacitor between the first and second electrodes varying according to a variation in an overlapping amount between the first and second electrodes, and an actuator which drives at least one of the first and second electrodes to change an overlapping amount between the first and second electrodes, wherein the actuator has a first beam portion which is formed to extend in a first direction with one end fixed at a substrate by use of a first supporting member and warped by residual stress with the first supporting member set as a starting point, a piezoelectric portion which is connected at one end to the other end of the first beam portion and formed to extend in a second direction intersecting with the first direction and moves parallel to the substrate in the first direction and in a direction opposite to the first direction by application of bias voltage, and a second beam portion which is connected at one end to the other end of the piezoelectric portion, formed to extend in a direction opposite to the first direction, connected at the other end to one of the first and second electrodes and warped in the same direction as the first beam portion by residual stress.

A semiconductor device according to still another aspect of this invention comprises a sheet-like member formed on a substrate, and a plurality of actuators which drive the sheet-like member in a direction parallel to the surface of the substrate, wherein each of the plurality of actuators has a first beam portion which is formed to extend in a first direction with one end fixed at a substrate by use of a supporting member and warped by residual stress with the supporting member set as a starting point, a piezoelectric portion which is connected at one end to the other end of the first beam portion and formed to extend in a second direction intersecting with the first direction and moves parallel to the substrate in the first direction and in a direction opposite to the first direction by application of bias voltage, and a second beam portion which is connected at one end to the other end of the piezoelectric portion, formed to extend in a direction opposite to the first direction, connected at the other end to one of the first and second electrodes and warped in the same direction as the first beam portion by residual stress.

BRIEF DESCRIPTION OF THE SEVERAL VIEWS OF THE DRAWING

FIG. 16 is a circuit diagram of a VCO to which the analog variable capacitor is applied;

DETAILED DESCRIPTION OF THE INVENTION

First Embodiment

Figure 1:
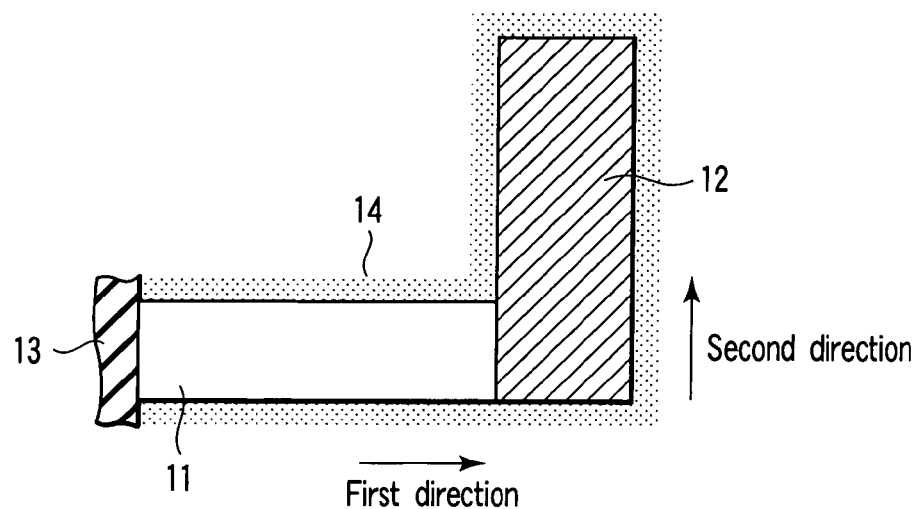
FIG. 1 is a plan view schematically showing an extracted main portion of a piezoelectric actuator before removing a sacrificial layer, for illustrating a semiconductor device according to a first embodiment of this invention.
Figure 2:
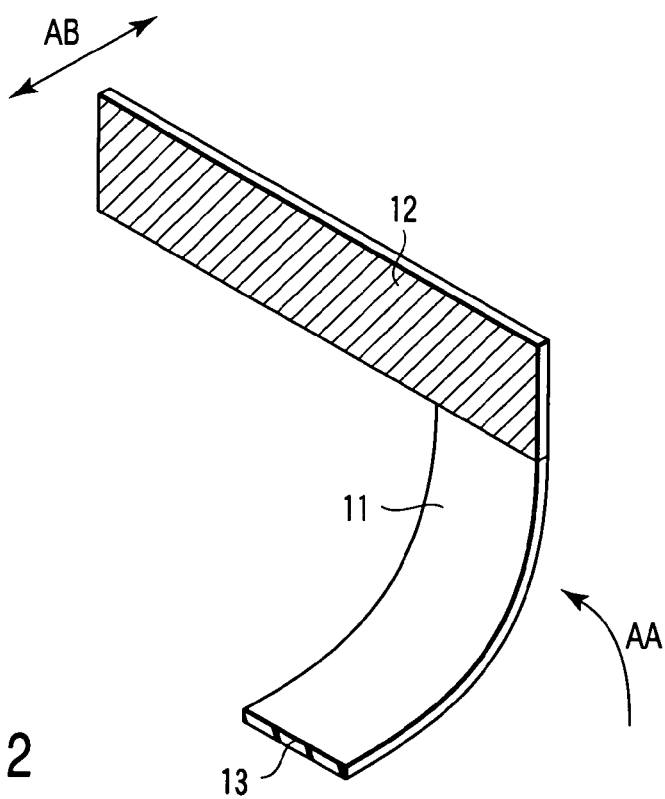
FIG. 2 is a perspective view schematically showing the extracted main portion of the piezoelectric actuator after removing the sacrificial layer, for illustrating the semiconductor device according to the first embodiment of this invention.

FIGS. 1 and 2 are respectively a plan view and perspective view each showing an extracted main portion of a piezoelectric actuator, for illustrating a semiconductor device according to a first embodiment of this invention. FIG. 1 shows a state set before a sacrificial layer is removed and FIG. 2 shows a state set after the sacrificial layer is removed.

As shown in FIG. 1, the piezoelectric actuator has a beam portion 11 and piezoelectric portion 12. One end of the beam portion 11 is fixed at a substrate by use of a supporting member (which is also called an anchor) 13 and the other end thereof is formed to extend in a first direction. One end of the piezoelectric portion 12 is connected to the other end of the beam portion 11 and the other end thereof is formed to extend in a second direction intersecting with the first direction.

In this example, the lengthwise direction of the rectangular beam portion 11 intersects at right angles with the lengthwise direction of the rectangular piezoelectric portion 12. However, it is only required for the beam portion 11 and piezoelectric portion 12 to intersect with each other and the intersecting angle is not necessarily limited to 90 degrees. The beam portion 11 and piezoelectric portion 12 are formed on a sacrificial layer 14 and the beam portion 11 is fixed on the substrate by the supporting member 13.

If cavities are formed under the beam portion 11 and piezoelectric portion 12 by removing the sacrificial layer 14, the end portion of the beam portion which lies in opposition to the supporting member 13 is warped upwardly by the residual stress of the beam portion 11 in a direction as indicated by an arrow AA in FIG. 2. As a result, the piezoelectric portion 12 rises in a direction perpendicular to the main surface of the substrate. If, in this state, bias voltage is applied to the piezoelectric portion 12 to drive the same, lateral displacement can be caused as shown by an arrow AB.

In FIG. 2, the piezoelectric portion 12 is set substantially perpendicular to the main surface of the substrate, but the piezoelectric portion 12 can be displaced in an oblique direction by setting the lifting angle of the beam portion 11 to an angle other than 90 degrees.

Figure 3:
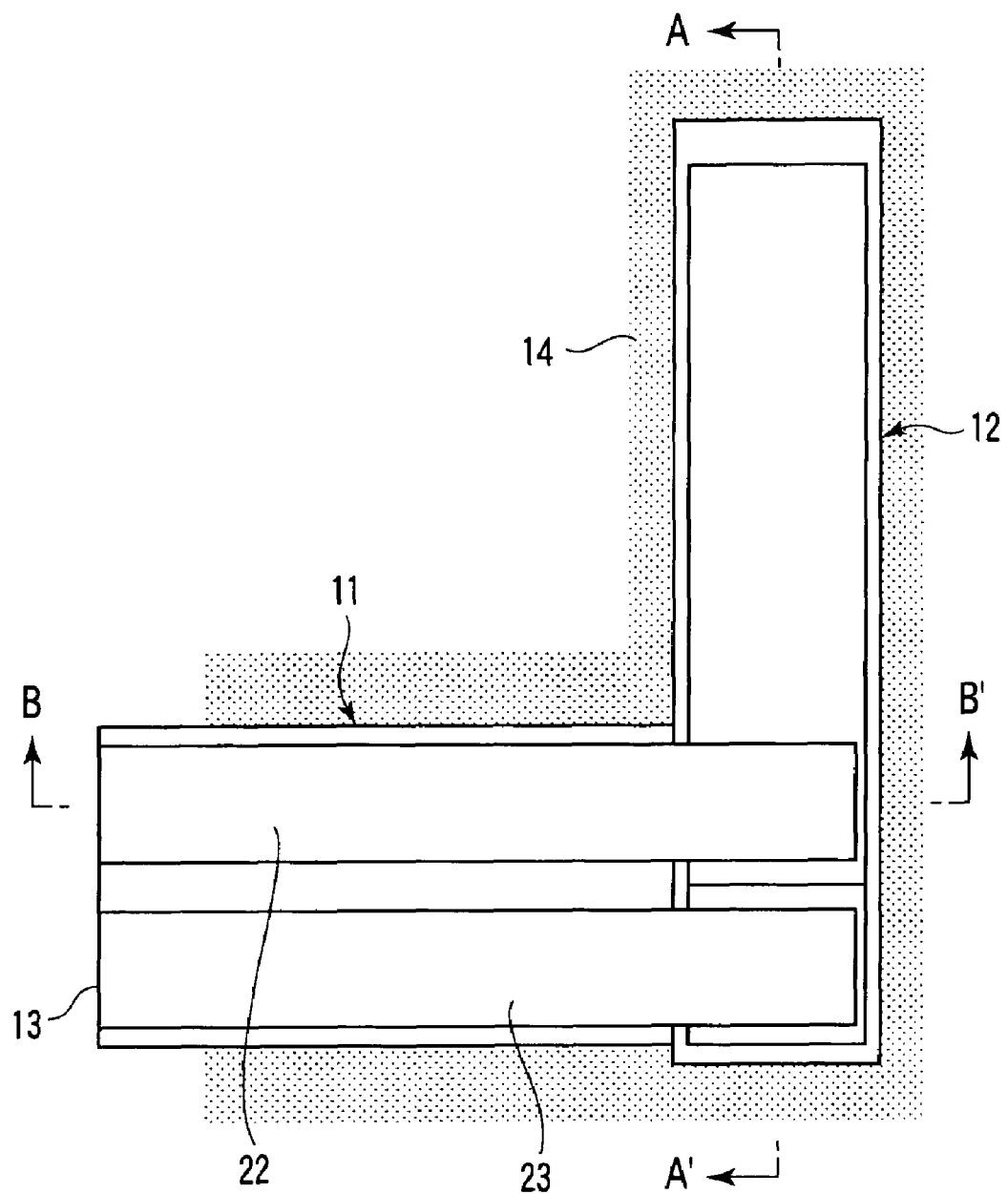
FIG. 3 is a pattern plan view showing an example of the configuration of the piezoelectric actuator.
Figure 4:
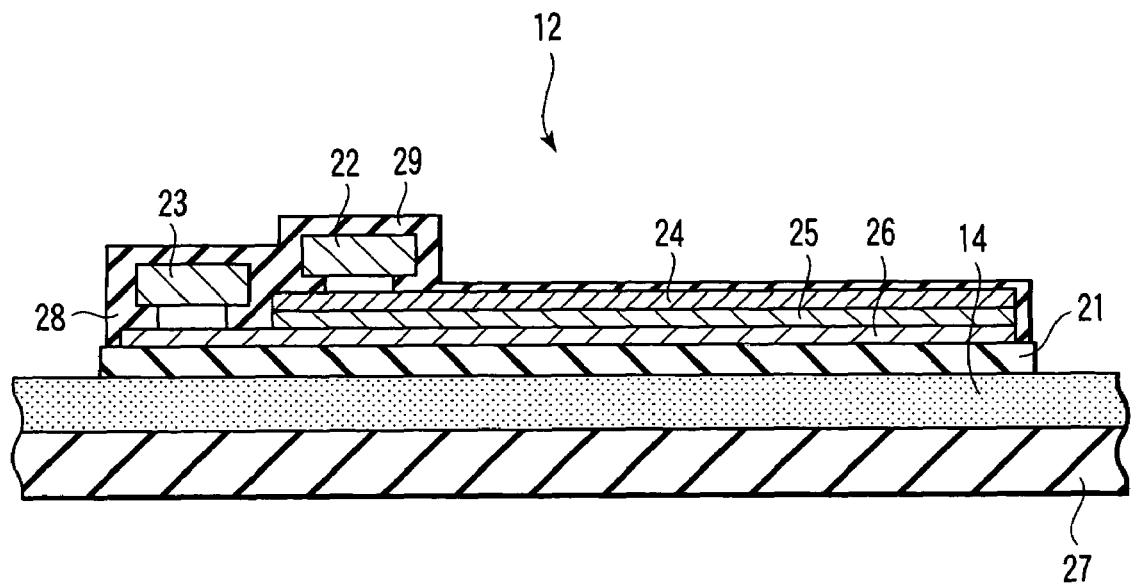
FIG. 4 is a cross-sectional view taken along the A-A' line of FIG. 3.
Figure 5:
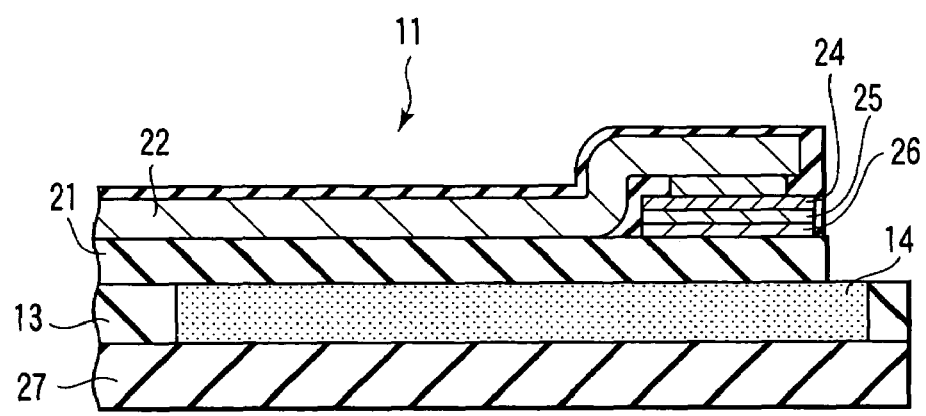
FIG. 5 is a cross-sectional view taken along the B-B' line of FIG. 3.

Next, the concrete configuration of a piezoelectric actuator formed by use of the MEMS technique is explained in detail with reference to FIGS. 3 to 5. FIG. 3 is a pattern plan view showing a concrete example of the configuration of the piezoelectric actuator, FIG. 4 is a cross sectional view taken along the A-A' line of FIG. 3 and FIG. 5 is a cross-sectional view taken along the B-B' line of FIG. 3. As shown in FIGS. 3 and 4, in the piezoelectric portion 12, a piezoelectric driving upper electrode 24 and piezoelectric driving lower electrode 26 are arranged on and under a piezoelectric film 25 to sandwich the piezoelectric film 25. As the piezoelectric film 25, for example, a material of AlN, PZT, ZnO or the like is used. The lower electrode 26, piezoelectric film 25 and upper electrode 24 are laminated on a supporting plate 21. The supporting plate 21 is formed on the sacrificial layer 14 formed on a substrate 27.

The piezoelectric film 25 is compressed or expanded to displace the piezoelectric portion 12 by applying a potential difference to the upper electrode 24 and lower electrode 26. The piezoelectric portion 12 is displaced in a direction perpendicular to the piezoelectric film 25, but it is displaced in a lateral direction with respect to the substrate 27 (in a horizontal direction with respect to the substrate) since the beam portion 11 is warped upwardly.

As shown in FIGS. 3 and 5, the beam portion 11 is configured by the supporting plate 21 and wirings 22, 23 arranged on the supporting plate 21. The wirings 22, 23 are respectively electrically connected to the piezoelectric driving upper electrode 24 and piezoelectric driving lower electrode 26. The supporting plate 21 is formed on the sacrificial layer 14 formed on the substrate 27.

The supporting plate 21 is formed of a material such as $SiO_2$ having compressive internal stress. On the other hand, the wirings 22, 23 are formed of a material such as AlN having tensile internal stress. Therefore, if the sacrificial layer 14 is removed, the beam portion 11 is warped upward with the supporting member 13 used as a starting point due to a difference between the internal stresses of the supporting plate 21 and the wirings 22, 23.

The residual stress which determines the warping amount of the beam portion 11 can be controlled by use of the materials of the supporting plate 21 and wirings 22, 23, the combination thereof, the thickness, width or cross-sectional area thereof. Further, if a layer such as a Ti layer having large compressive stress is arranged below the Al wirings 22, 23, the radius of curvature in the warped state can be made small.

The piezoelectric actuator shown in FIGS. 3 to 5 can be formed by use of a known manufacturing process of a semiconductor device, for example. That is, a sacrificial layer 14 is first formed on a substrate 27 and a supporting plate 21 formed of $SiO_2$ or the like is formed on the sacrificial layer 14.

Then, a lower electrode 26, piezoelectric film 25 and upper electrode 24 are sequentially laminated on the supporting plate 21 and patterned to form a piezoelectric portion 12. An insulating film 28 is formed on the piezoelectric portion 12 and a metal layer such as an Al layer is formed on the insulating film 28. The metal layer is patterned to form wirings 22, 23 which are respectively set in contact with the lower electrode 26 and upper electrode 24. A surface protection film 29 is formed on the wirings 22, 23 and upper electrode 24.

After forming the piezoelectric portion 12 and wirings 22, 23 as described above, the sacrificial layer 14 is removed by etching or the like. When the sacrificial layer 14 is removed and cavities are formed under the beam portion 11 and piezoelectric portion 12, the other end of the beam portion 11 is upwardly warped with the supporting member 13 used as a starting point due to the residual stress of the beam portion 11, that is, a difference between the internal stresses of the supporting plate 21 and the wirings 22, 23. Thus, the configuration as shown in FIG. 2 can be obtained.

Therefore, according to the above configuration, a piezoelectric actuator which can cause large lateral displacement can be formed.

Second Embodiment

Figure 6:
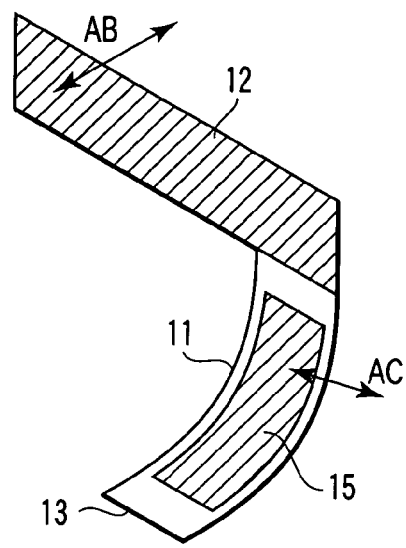
FIG. 6 is a schematic perspective view showing an extracted main portion of a piezoelectric actuator, for illustrating a semiconductor device according to a second embodiment of this invention.

FIG. 6 is a schematic perspective view showing an extracted main portion of a piezoelectric actuator, for illustrating a semiconductor device according to a second embodiment of this invention. In the second embodiment, a piezoelectric portion 15 is formed on the beam portion 11 in the piezoelectric actuator shown in FIGS. 1 and 2. Like the piezoelectric portion 12, the piezoelectric portion 15 has a configuration in which a piezoelectric driving upper electrode and piezoelectric driving lower electrode are arranged on and under a piezoelectric film to sandwich the piezoelectric film. For example, a material of AlN, PZT, ZnO or the like is used to form the piezoelectric film of the piezoelectric portion 15. The piezoelectric film is compressed or expanded to displace the beam portion 11 in a direction indicated by an arrow AC, that is, change the warping amount thereof by applying a potential difference between the upper electrode and the lower electrode.

With the above configuration, since the piezoelectric portion 12 can be displaced in the direction indicated by the arrow AC in addition to the direction indicated by the arrow AB, the displacement amount can be made larger or finely adjusted. Therefore, a piezoelectric actuator having a larger degree of freedom in movement can be formed.

Third Embodiment

Figure 7:
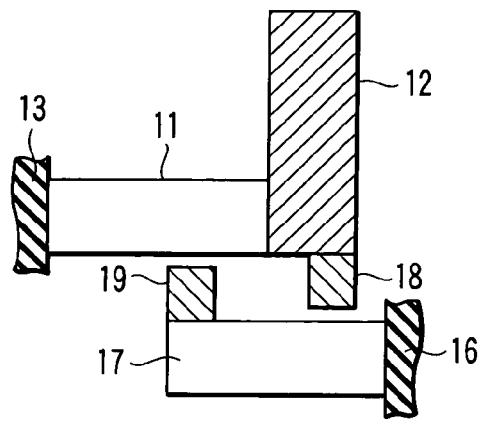
FIG. 7 is a plan view schematically showing an extracted main portion of a piezoelectric actuator before removing a sacrificial layer, for illustrating a semiconductor device according to a third embodiment of this invention.
Figure 8:
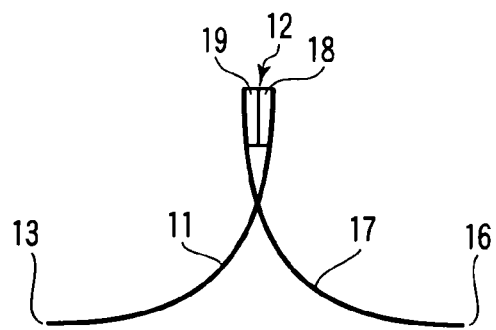
FIG. 8 is a side view schematically showing the extracted main portion of the piezoelectric actuator after removing the sacrificial layer, for illustrating the semiconductor device according to the third embodiment of this invention.

FIGS. 7 and 8 are respectively a plan view and side view each schematically showing an extracted main portion of a piezoelectric actuator, for illustrating a semiconductor device according to a third embodiment of this invention. In the third embodiment, a second beam portion 17 which has one end fixed by use of a supporting member 16, has the other end formed to extend in a direction opposite to that of the beam portion 11 and is warped in a direction opposite to that of the beam portion 11 due to the residual stress with the supporting member 16 used as a starting point is provided in addition to the configuration of the first embodiment. As shown in FIG. 8, the first and second beam portions 11, 17 are fixed by use of engaging portions 18, 19 provided on the opposite sides with respect to the supporting members 13, 16 while they are warped upwardly.

With the above configuration, since the two beam portions 11, 17 are fixed by use of the engaging portions 18, 19 while they are warped upwardly, the angle of the piezoelectric portion 12 to the substrate surface can be set at approximately 90 degrees. Further, since the two beam portions 11, 17 are set in contact and fixed while they are warped upwardly, the mechanical strength thereof can be enhanced.

In FIGS. 7 and 8, the piezoelectric portion 12 is provided only on the beam portion 11, but it is also possible to provide a piezoelectric portion on the other end side of the beam portion 17 which lies in opposition to the supporting member 16. In this case, it is possible to apply a potential difference to cause the two piezoelectric portions to be displaced in the same direction or apply potential differences of different magnitudes to cause the two piezoelectric portions to be displaced in opposite directions.

Of course, like the second embodiment, it is also possible to provide a piezoelectric portion on at least one of the two beam portions 11, 17.

Fourth Embodiment

Figure 9:
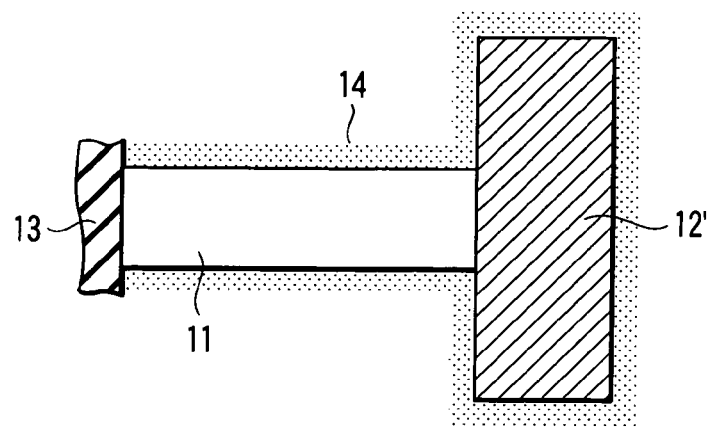
FIG. 9 is a plan view schematically showing an extracted main portion of a piezoelectric actuator before removing a sacrificial layer, for illustrating a semiconductor device according to a fourth embodiment of this invention.
Figure 10:
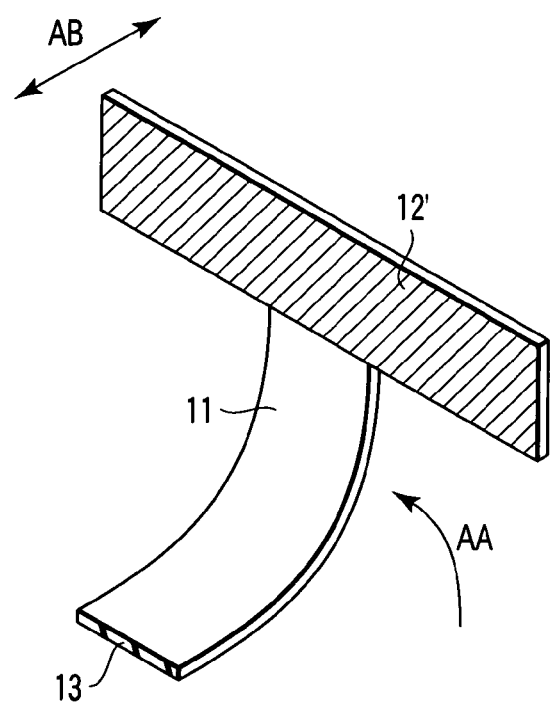
FIG. 10 is a perspective view schematically showing the extracted main portion of the piezoelectric actuator after removing the sacrificial layer, for illustrating the semiconductor device according to the fourth embodiment of this invention.

FIGS. 9 and 10 are respectively a plan view and perspective view each schematically showing an extracted main portion of a piezoelectric actuator, for illustrating a semiconductor device according to a fourth embodiment of this invention. In the first embodiment, the end portion of the beam portion 11 and the end portion of the piezoelectric portion 12 are connected together to configure an L-shaped piezoelectric actuator. However, in the fourth embodiment, the end portion of the beam portion 11 and a portion near the central portion of a piezoelectric portion 12' are connected together to configure a T-shaped piezoelectric actuator.

The other basic configuration, operation and effect are the same as those of the first embodiment, like portions are denoted by the same reference symbols and the detail explanation thereof is omitted.

The configuration of the piezoelectric actuator is not limited to the L or T shape and the end portion of the beam portion 11 and the end portion of the piezoelectric portion 12 can be connected with a preset angle or curvature.

Fifth Embodiment

Figure 11:
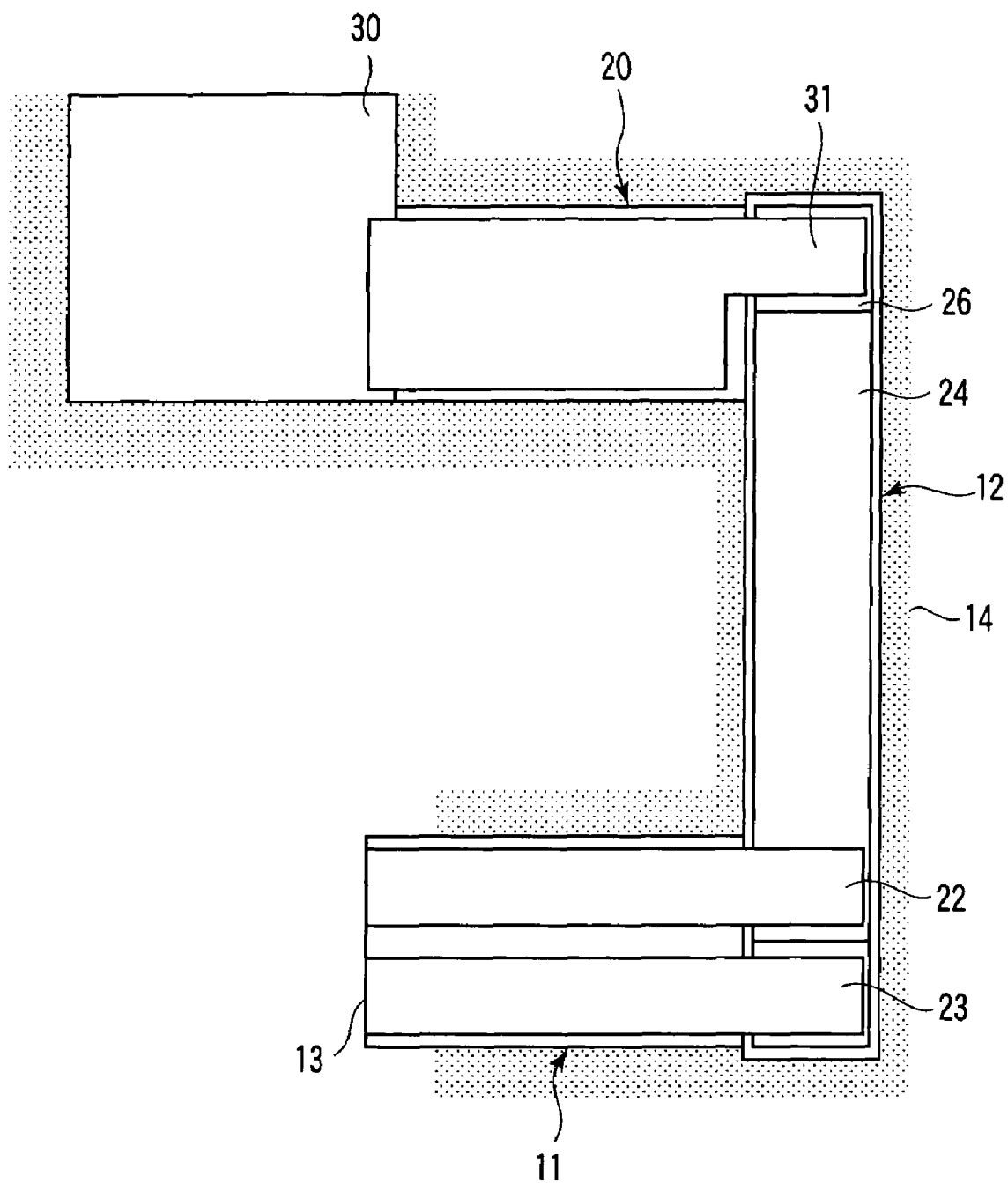
FIG. 11 is a pattern plan view showing a concrete example of the configuration of an extracted main portion of a piezoelectric actuator, for illustrating a semiconductor device according to a fifth embodiment of this invention.

FIG. 11 is a pattern plan view showing a concrete example of the configuration of a piezoelectric actuator, for illustrating a semiconductor device according to a fifth embodiment of this invention. The piezoelectric actuator has a configuration in which two L-shaped piezoelectric actuators shown in the first embodiment are connected in a U-shaped configuration.

That is, the first beam portion 11 of the piezoelectric actuator is formed to extend in a first direction (lateral direction) with one end (the base portion) of the first beam portion 11 fixed at the substrate by the supporting member 13. The piezoelectric portion 12 is formed to extend in a second direction (vertical direction) intersecting with the beam portion 11 and one end thereof is connected to the other end of the beam portion 11. A piezoelectric driving upper electrode 24 and piezoelectric driving lower electrode 26 are arranged to sandwich a piezoelectric film in the piezoelectric portion 12. One end of a second beam portion 20 is connected to the other end of the piezoelectric portion 12 and the other end (the base portion) thereof is fixed at an electrode 30. A wiring 31 is connected to the beam portion 20 and electrically connected to the piezoelectric driving lower electrode 26 in the piezoelectric portion 12.

The electrode 30 is applied with voltage via the wiring 23, piezoelectric driving lower electrode 26 and wiring 31. In this case, it is possible to apply voltage to the electrode 30 via the piezoelectric driving upper electrode 24. The piezoelectric portion 12 moves in a lateral direction, that is, parallel to the surface at which the beam portion 11 is fixed by the supporting member 13 in a first direction and in a direction opposite to the first direction by applying bias voltage.

Various MEMS devices can be realized by combining the above piezoelectric actuator and various members. Next, various application examples using the piezoelectric actuator shown in FIG. 11 are explained.

First Application Example

Figure 12:
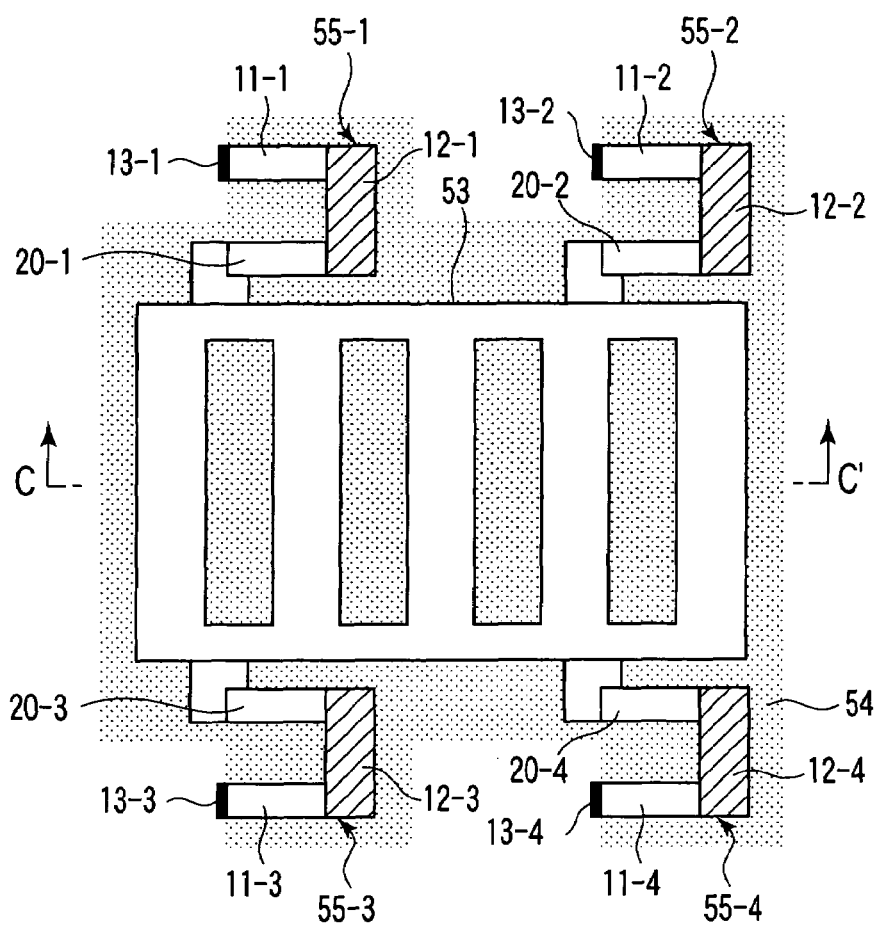
FIG. 12 is a pattern plan view showing an analog variable capacitor before removing a sacrificial layer in an analog variable capacitor, for illustrating a first application example of a piezoelectric actuator.
Figure 13:
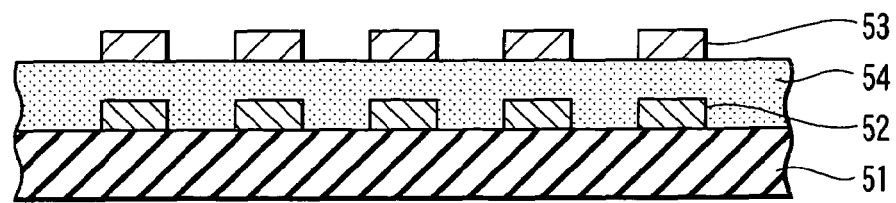
FIG. 13 is a cross-sectional view taken along the C-C' line of FIG. 12.

First, a first application example using the above piezoelectric actuator is explained. FIG. 12 is a pattern plan view showing an analog variable capacitor and FIG. 13 is a cross-sectional view taken along the C-C' line of FIG. 12. Each of the drawings shows a state before removing a sacrificial layer. First and second electrodes 52 and 53 are arranged to face each other with a sacrificial layer 54 disposed therebetween on a substrate 51. Each of the electrodes 52, 53 has a rectangular form having a plurality of slit-form windows. Actuators 55-1 to 55-4 with the same configuration as that shown in FIG. 11 are arranged near the corner portions of the electrode 53.

One-side ends of first beam portions 11-1 to 11-4 of the actuators 55-1 to 55-4 are respectively fixed by supporting members 13-1 to 13-4 and the other ends thereof are formed to extend in a lateral direction (first direction). One-side ends of piezoelectric portions 12-1 to 12-4 are respectively connected to the other ends of the first beam portions 11-1 to 11-4 and formed to extend in a vertical direction (second direction) intersecting (for example, at right angles) with the first direction. One-side ends of second beam portions 20-1 to 20-4 are respectively connected to the other ends of the piezoelectric portions 12-1 to 12-4 and formed to extend in a direction opposite to the first direction and the other ends thereof are connected to the electrode 53.

Figure 14:
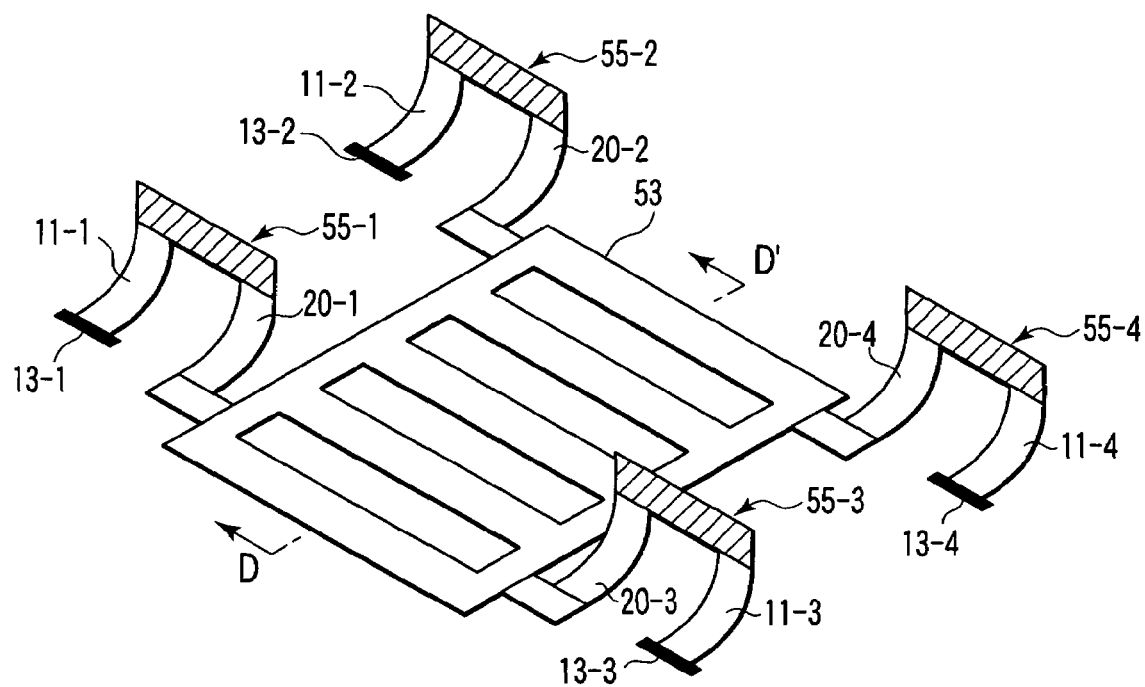
FIG. 14 is a perspective view showing a state set after removing the sacrificial layer in the analog variable capacitor shown in FIG. 12.

FIG. 14 is a perspective view showing a state after removing the sacrificial layer 54. The first beam portions 11-1 to 11-4 are warped by residual stress with the supporting members 13-1 to 13-4 used as starting points and the second beam portions 20-1 to 20-4 are also warped in the same manner by residual stress. The second electrode 52 is fixed on the substrate 51 and the first electrode 53 is set in a floating state above the substrate 51. A plurality (in this example, four) of piezoelectric actuators 55-1 to 55-4 are connected to portions near the corner portions of the first electrode 53. The piezoelectric portions 12-1 to 12-4 move parallel to the surface (the main surface of the substrate 51) on which the beam portions 11-1 to 11-4 are fixed by use of the supporting members 13-1 to 13-4 in the extending directions of the beam portions 11-1 to 11-4 or in opposite directions.

Figure 15:
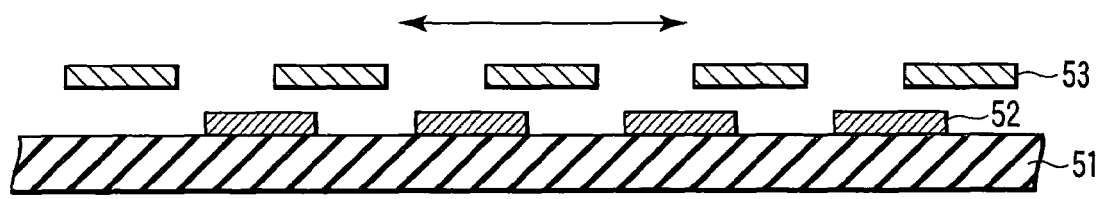
FIG. 15 is a cross-sectional view taken along the D-D' line of FIG. 14, for illustrating a variation in the capacitance of the analog variable capacitor.

The first and second electrodes 53, 52 each have a rectangular form having a plurality of slit-form windows and are arranged in opposition to each other to at least partly overlap each other. The electrodes 53, 52 configure a capacitor and the capacitance thereof is changed by changing the overlapping area between the electrodes 53 and 52 as shown in FIG. 15. The variable capacitor (hit-and-miss lattice type variable capacitor) can change the capacitance thereof in an analog fashion according to the overlapping area between the electrodes 53 and 52. A variation amount of the capacitance varies in proportion to the potential difference applied to the piezoelectric film, and therefore, it can be easily controlled. Further, since the piezoelectric actuator is used, the capacitance can be changed at low voltage with low power consumption.

Based on the above feature, the variable capacitor of the first application example is suitable for a circuit such as a VCO shown in FIG. 16 which requires feedback control, for example.

FIG. 16 shows an example of the circuit configuration of a VCO having the analog variable capacitor (expressed by VC) mounted thereon. The VCO is configured to include inductors L1, L2, analog variable capacitor VC, transistors Q1, Q2 and constant current source CI. One-side ends of the inductors L1, L2 are connected to a power supply Vcc and the other ends thereof are respectively connected to one-side ends of the current paths of the transistors Q1, Q2. The gates of the transistors Q1, Q2 are respectively connected to the other ends of the inductors L2, L1. Further, the analog variable capacitor VC is connected between the other ends of the inductors L1 and L2. The constant current source CI is connected between the other ends of the current paths of the transistors Q1, Q2 and a ground node Vss.

The VCO with the above configuration is suitable for mobile telephones since the capacitance thereof can be changed in an analog fashion at low voltage with low power consumption.

In this application example, a case wherein the upper electrode 53 is moved is explained, but it is also possible to move the lower electrode 52 while the upper electrode 53 is fixed or relatively move both of the electrodes to change the overlapping area.

Further, a case of the example of application to the VCO is explained, but it can be applied to another variable capacitor of an antenna matching circuit.

Figure 17:
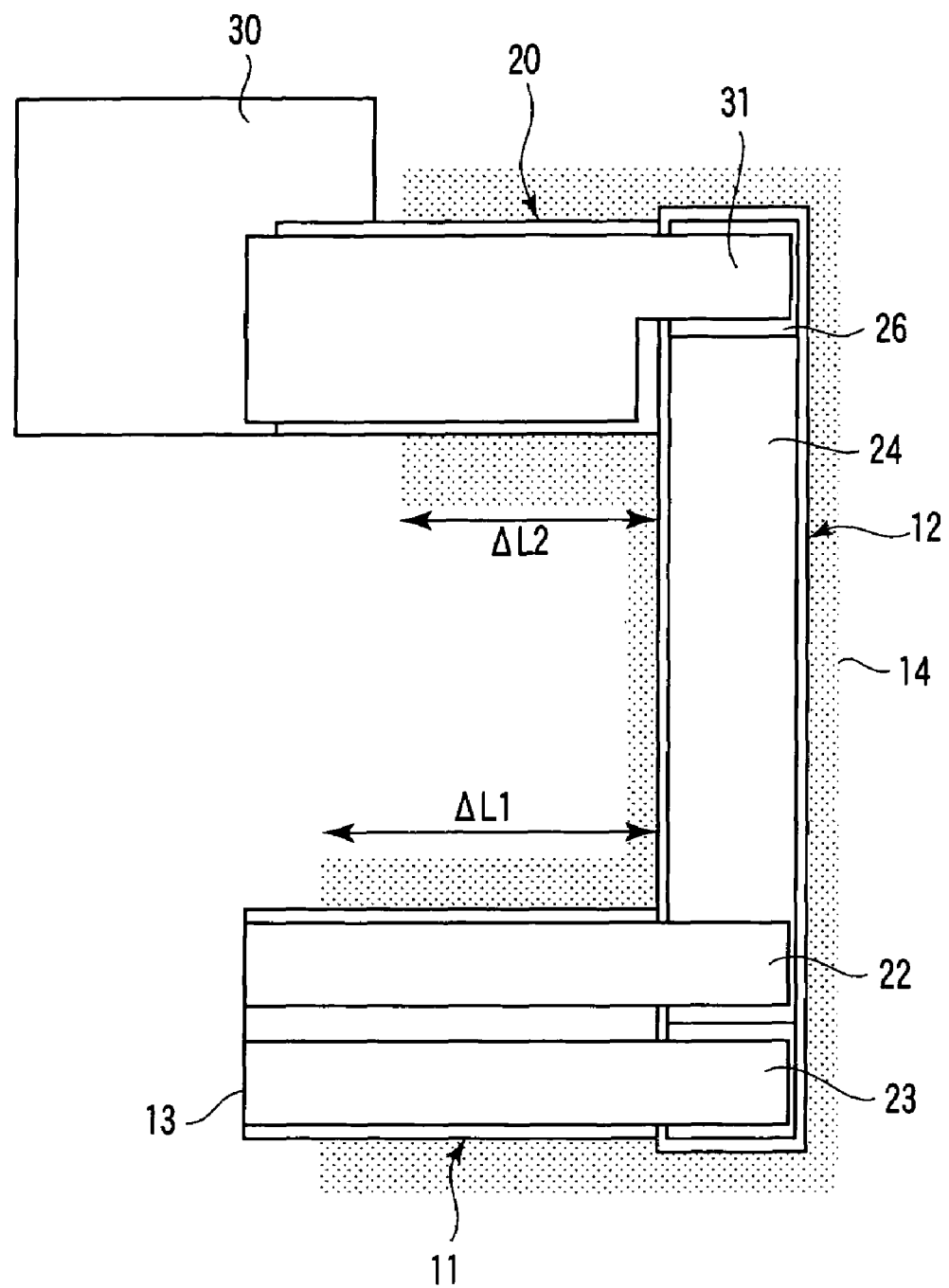
FIG. 17 is a pattern plan view showing another concrete example of the configuration of an extracted main portion of a piezoelectric actuator, for illustrating a modification of the piezoelectric actuator shown in FIG. 11.

Further, in FIG. 11, a case wherein a distance (ΔL1) from the supporting member 13 of the first beam portion 11 to the piezoelectric portion 12 is set equal to a distance (ΔL2) from the electrode 30 of the second beam portion 20 to the piezoelectric portion 12 is explained. However, it is also possible to make the distances ΔL1, ΔL2 different from each other as shown in FIG. 17. As a result, the distance between the first and second electrodes 53 and 52 when the first, second beam portions 11, 20 are warped upwardly can be adjusted. Particularly, if the relation of "ΔL1>ΔL2" is set, the distance between the first and second electrodes 53 and 52 can be increased in comparison with that set before the sacrificial layer 54 is removed since the first electrode 53 is floated high when they are warped upwardly. This means that an MEMS variable capacitor can be formed even when the thickness of the sacrificial layer 54 is small. Thus, if the sacrificial layer 54 is thin, an advantage that the contact resistance to the electrode 52 can be lowered is attained.

Second Application Example

Figure 18A:
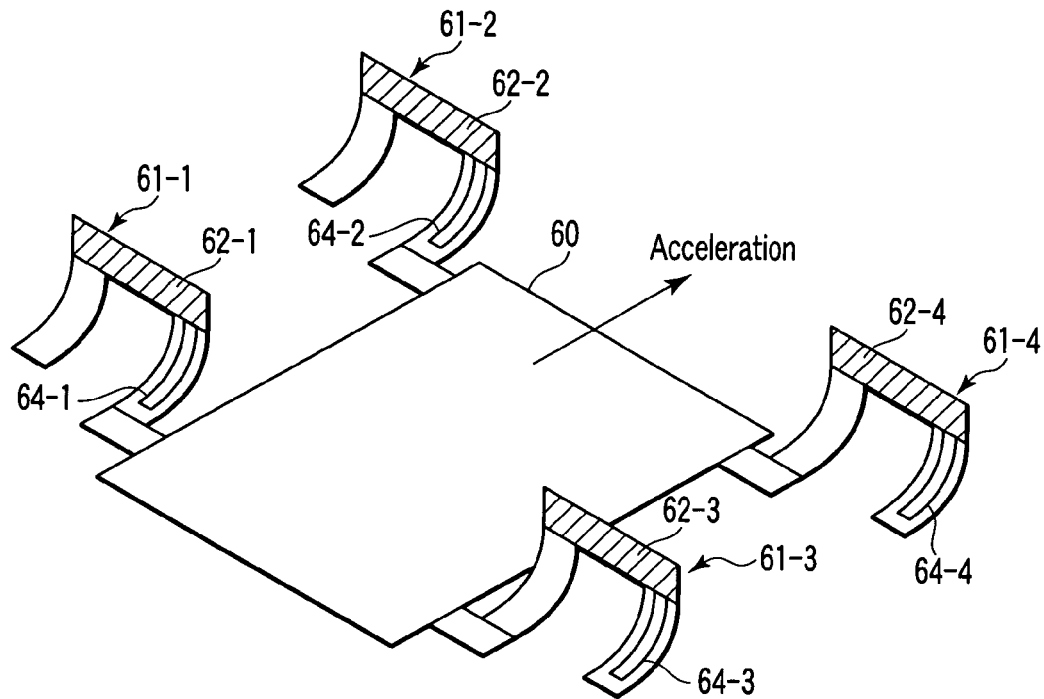
FIG. 18A is a perspective view showing an example of the configuration of an acceleration sensor, for illustrating a second application example of the piezoelectric actuator.
Figure 18B:
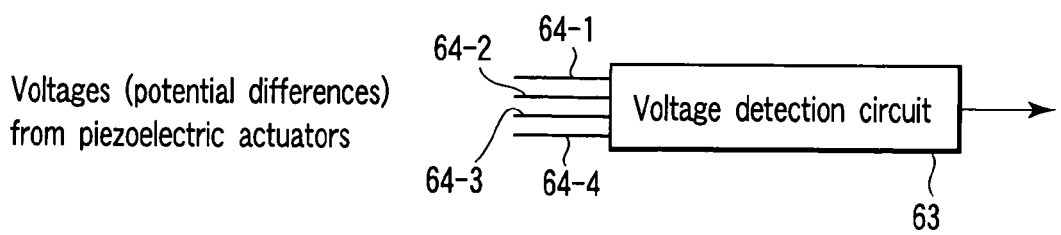
FIG. 18B is a block diagram showing a voltage detection circuit, for illustrating the second application example of the piezoelectric actuator.

FIGS. 18A and 18B each show a second application example of this invention which includes an example of the configuration of an acceleration sensor and a voltage detection circuit. If acceleration in a direction indicated by an arrow in the drawing is applied to a detection plate 60 used to detect the acceleration shown in FIG. 18A, stress is applied to piezoelectric films 62-1 to 62-4 of piezoelectric actuators 61-1 to 61-4 to induce voltages and a voltage difference occurs between the upper electrode and the lower electrode of each of the piezoelectric films 62-1 to 62-4. The acceleration can be detected by supplying the potential difference to a voltage detection circuit 63 shown in FIG. 18B via the wirings 64-1 to 64-4 and monitor the magnitude thereof.

At this time, the acceleration not only in one direction but also in X, Y directions can be monitored by detecting differences piezoelectrically induced charge of a plurality of piezoelectric films 62-1 to 62-4 by use of the voltage detection circuit 63.

Third Application Example

Figure 19:
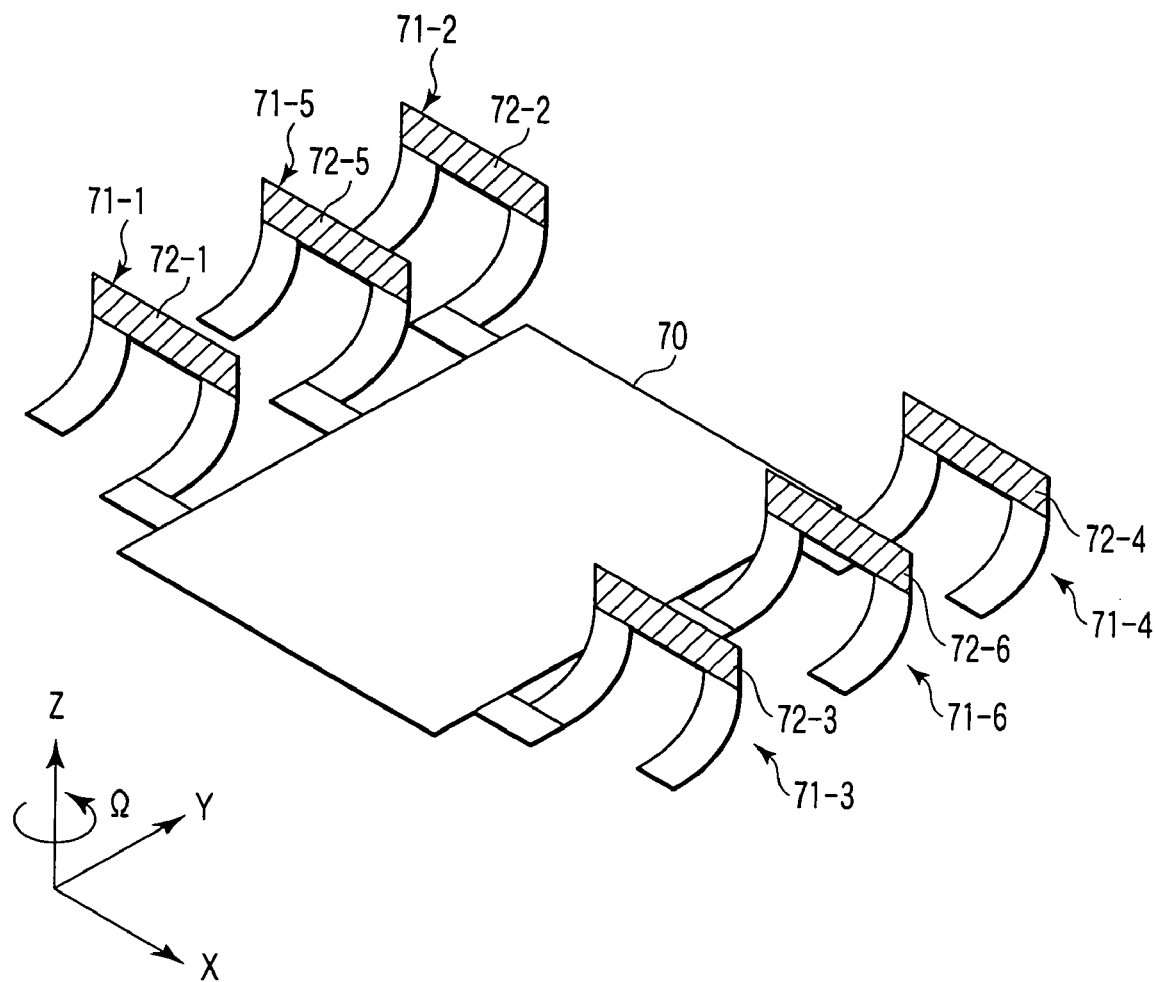
FIG. 19 is a perspective view showing an example of the configuration of a gyroscope, for illustrating a third application example of the piezoelectric actuator.

FIG. 19 illustrates a third application example of this invention and shows an example of the configuration of a gyroscope (which is hereinafter referred to as a gyro). In the present application example, piezoelectric actuators are used to cause reference vibration and detect the Coriolis force. Piezoelectric films 72-1 to 72-4 in piezoelectric actuators 71-1 to 71-4 arranged in portions near the corner portions of a detecting plate 70 are used to cause reference vibration. That is, an electric field of oscillation waveform is applied to the piezoelectric films 72-1 to 72-4 to cause reference vibration in the Y-axis direction. In this state, if the system is rotated around the Z axis, Coriolis force occurs in the X-axis direction. Angular velocity can be detected by detecting the Coriolis force by use of a difference between the potential differences formed by piezoelectric films 72-5, 72-6 of piezoelectric actuators 71-5 to 71-6.

Fourth Application Example

Figure 20:
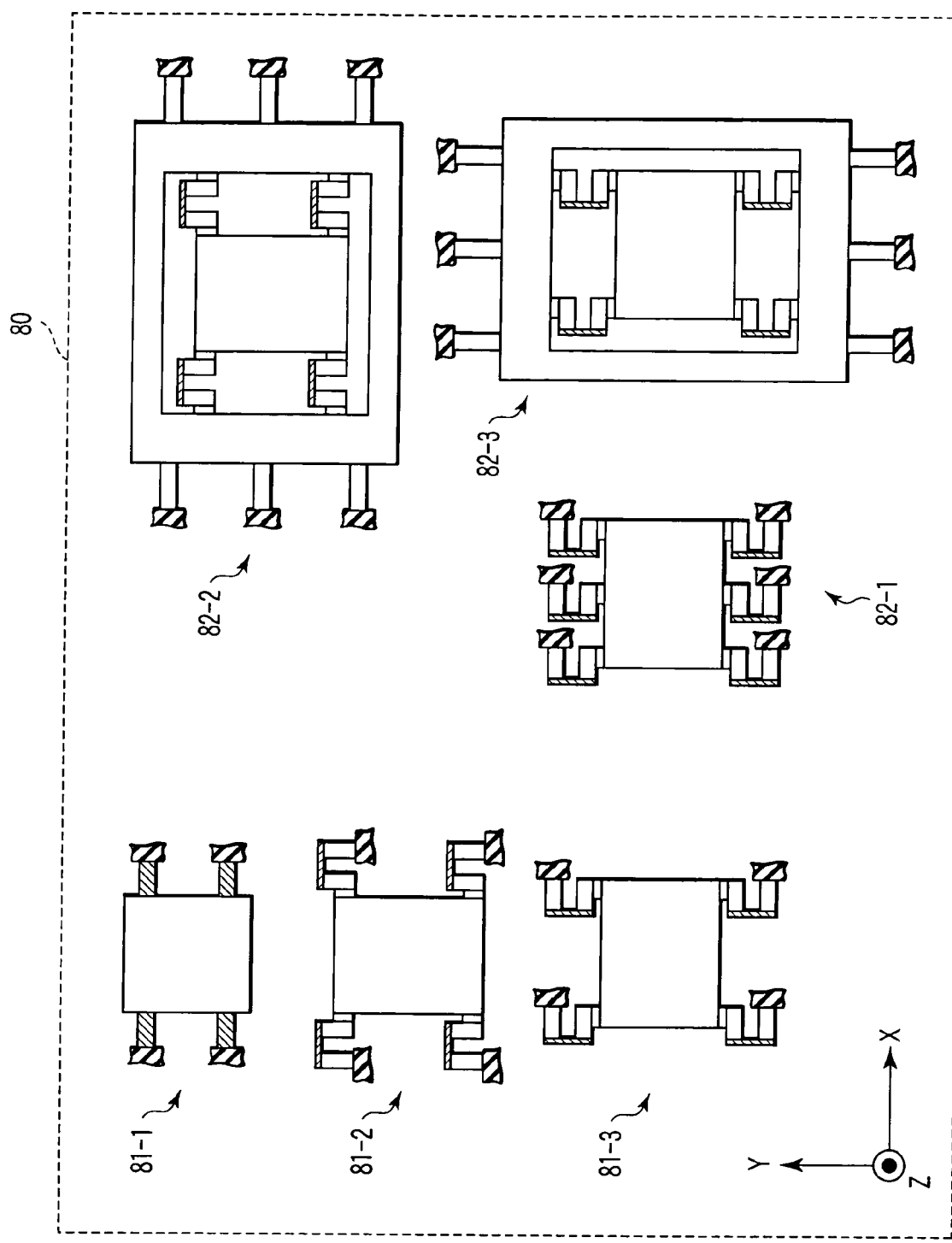
FIG. 20 is a plan view showing an inertia sensor chip having three-axis acceleration sensors and three-axis gyros mounted on one chip, for illustrating a fourth application example of the piezoelectric actuator.

FIG. 20 is a view for illustrating a fourth application example of this invention and an inertia sensor chip 80 having three-axis acceleration sensors 81-1 to 81-3 and three-axis gyros 82-1 to 82-3 mounted on one chip is configured. The piezoelectric film of the acceleration sensor 81-1 is arranged parallel to the substrate to detect acceleration in the Z-axis direction. The acceleration sensors 81-2, 81-3 are configured to detect accelerations in the Y-axis and Z-axis directions.

The gyro 82-1 can detect angular velocity around the Z axis. The piezoelectric film on the peripheral portion of the gyro 82-2 is arranged parallel to the substrate. The piezoelectric film is used to cause reference vibration in the Z-axis direction. If rotation around the X axis occurs while the reference vibration is being formed, the Coriolis force occurs in the Y axis. Angular velocity around the X axis can be detected by detecting the Coriolis force by use of the inner piezoelectric film. Likewise, the gyro 82-3 can detect angular velocity around the Y axis.

By using the above chip configuration, the three-axis acceleration sensors and three-axis gyros which can be operated at low voltage with low power consumption can be formed in one chip. As a result, the volume and cost of the sensor portion can be reduced in comparison with those of a case wherein a plurality of single-axis or two-axis inertia sensors are used.

The acceleration sensor and gyro can be used as an input device such as a remote controller, 3-dimensional mouse and a mobile telephone which can achieve gesture control, for example.

Particularly, when they are used for the mobile telephone and remote control, the number of control switches is reduced and an input device which can be easily controlled by a beginner can be provided. Further, position information can be acquired by combining them with the global positioning system (GPS) in the mobile telephone. Further, they can be used for attitude control of robots or the like.

Fifth Application Example

Figure 21:
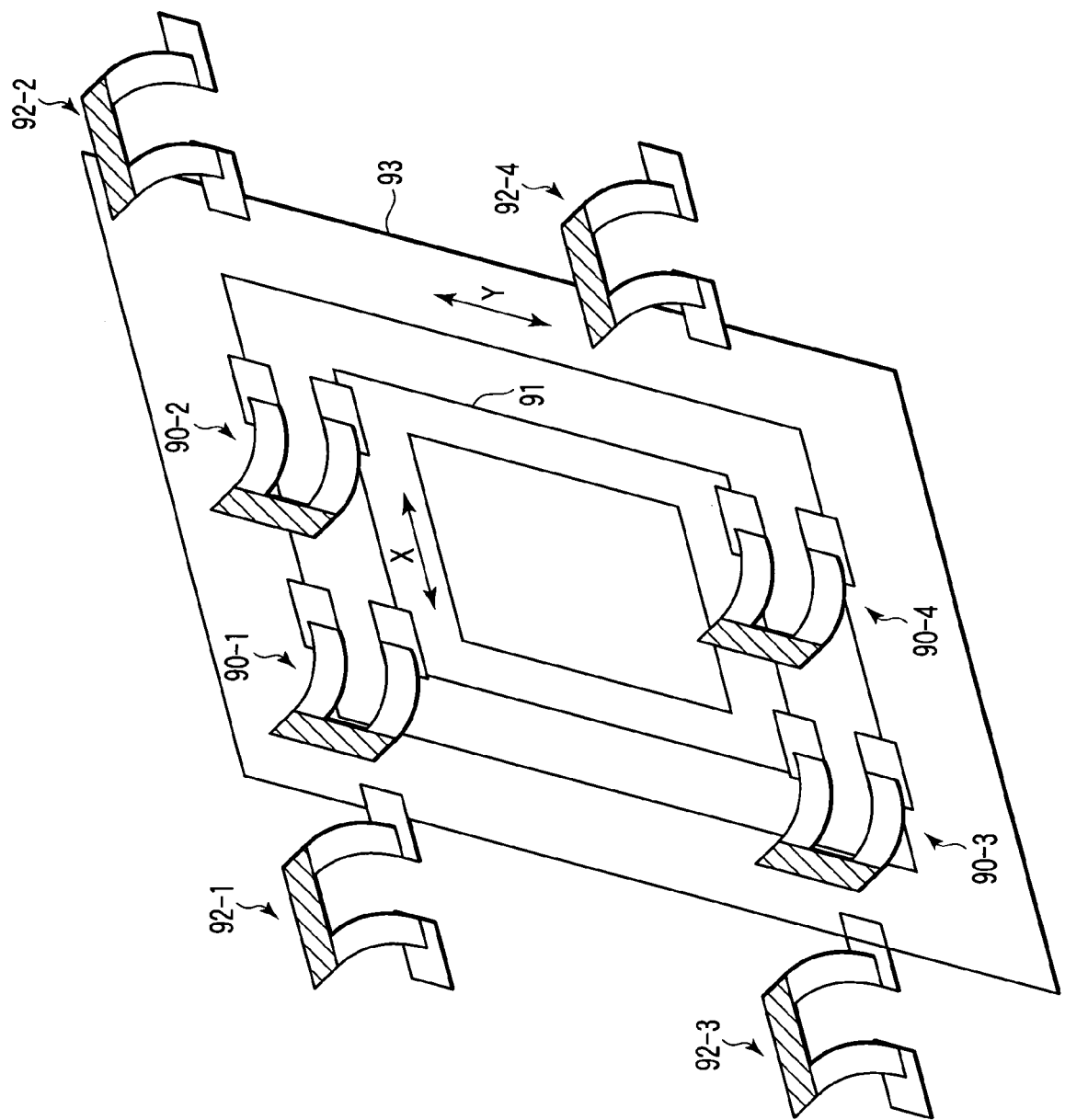
FIG. 21 is a perspective view showing an XY stage, for illustrating a fifth application example of the piezoelectric actuator.

FIG. 21 is a view for illustrating a fifth application example of this invention and shows an XY stage. The stage can be displaced in X, Y directions and moved in two directions in the plane by arranging U-shaped piezoelectric actuators as shown in FIGS. 11 and 17 in directions which intersect at right angles with each other. Piezoelectric actuators 90-1 to 90-4 drive a stage 91 in the X direction and piezoelectric actuators 92-1 to 92-4 drive a stage 93 in the Y direction. The piezoelectric actuators 90-1 to 90-4 have beam portions connected between the stages 91 and 93. Further, one beam portion of each of the piezoelectric actuators 92-1 to 92-4 is connected to the stage 93 and the other beam portion is fixed.

With the above configuration, the piezoelectric actuators 90-1 to 90-4 drive the stage 91 in the X direction and the piezoelectric actuators 92-1 to 92-4 drive the stage 93 in the Y direction so as to freely move the stage 91 in the X, Y directions. The XY stage can be used for a probe type memory.

As in the first to fifth application examples, when a plurality of piezoelectric actuators are used, a difference in the warping amounts of the beam portions caused by a variation in residual stresses can be reduced to substantially a negligible degree by using parts of the same lot.

Further, at the time of voltage application to the piezoelectric portion, a variation in the displacement is measured and the measured value is fed back to the voltage application circuit of the piezoelectric portion so as to control the warping amount.

As described above, according to one aspect of this invention, since the piezoelectric portion is inclined at substantially 90 degrees with respect to the substrate by upward warping of the beam portion by residual stress, displacement in the lateral direction may be attained by driving the piezoelectric portion.

Therefore, a piezoelectric actuator which can cause large displacement in the lateral direction at low voltage with low power consumption can be formed. Further, a switch, variable capacitor, acceleration sensor, gyroscope, inertia sensor chip and XY stage can be formed by use of the piezoelectric actuator.

As described above, according to one aspect of this invention, a semiconductor device having piezoelectric actuators which can cause large displacement in the lateral direction can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first beam portion which is formed to extend in a first direction with one end thereof fixed at a substrate by use of a first supporting member and warped by residual stress with the first supporting member set as a starting point, and
    a first piezoelectric portion which is connected to the other end of the first beam portion and formed to extend in a second direction intersecting with the first direction and moves parallel to the substrate in the first direction and in a direction opposite to the first direction by application of first bias voltage.

2. The semiconductor device according to claim 1, wherein the first piezoelectric portion includes a piezoelectric film, first and second piezoelectric driving electrodes which sandwich the piezoelectric film and a supporting plate on which the piezoelectric film and first and second piezoelectric driving electrodes are mounted.

3. The semiconductor device according to claim 2, wherein the first beam portion includes first and second wirings formed on the supporting plate and respectively connected to the first and second piezoelectric driving electrodes.

4. The semiconductor device according to claim 3, wherein the supporting plate is formed of a material having compressive internal stress and the first and second wirings are formed of a material having tensile internal stress.

5. The semiconductor device according to claim 1, further comprising a second piezoelectric portion which is formed on the first beam portion and drives the first beam portion in a direction to change a warping amount of the first beam portion by application of second bias voltage.

6. The semiconductor device according to claim 1, in which one end of the first piezoelectric portion is connected to the other end of the first beam portion and which further comprises a second beam portion which is connected at one end to the other end of the first piezoelectric portion and formed to extend in a direction opposite to the first direction and warps in the same direction as that of the first beam portion by residual stress.

7. The semiconductor device according to claim 6, further comprising an electrode used as a driven object and connected to the other end of the second beam portion.

8. The semiconductor device according to claim 7, wherein a distance from the first supporting portion in the first beam portion to the first piezoelectric portion is different from a distance from the electrode of the to-be-driven object in the second beam portion to the first piezoelectric portion.

9. The semiconductor device according to claim 1, further comprising a second beam portion which is formed to extend in a direction opposite to the first direction with one end thereof fixed by use of a second supporting member, warps in a direction opposite to that of the first beam portion by residual stress with the second supporting member used as a starting point and is formed in contact with part of the first beam portion.

10. A semiconductor device comprising:
a first electrode,
a second electrode arranged in opposition to the first electrode to at least partly overlap the first electrode, a capacitance of a capacitor between the first and second electrodes varying according to a variation in an overlapping amount between the first and second electrodes, and
an actuator which drives at least one of the first and second electrodes to change an overlapping amount between the first and second electrodes,
wherein the actuator has a first beam portion which is formed to extend in a first direction with one end fixed at a substrate by use of a supporting member and warped by residual stress with the supporting member set as a starting point,
a piezoelectric portion which is connected at one end to the other end of the first beam portion and formed to extend in a second direction intersecting with the first direction and moves parallel to the substrate in the first direction and in a direction opposite to the first direction by application of bias voltage, and
a second beam portion which is connected at one end to the other end of the piezoelectric portion, formed to extend in a direction opposite to the first direction, connected at the other end to one of the first and second electrodes and warped in the same direction as the first beam portion by residual stress.

11. The semiconductor device according to claim 10, wherein each of the first and second electrodes has a rectangular form having a plurality of slit-form windows.

12. The semiconductor device according to claim 11, wherein the actuator is arranged near a corner portion of one of the first and second electrodes.

13. The semiconductor device according to claim 10, wherein the piezoelectric portion includes a piezoelectric film, first and second piezoelectric driving electrodes disposed to sandwich the piezoelectric film and a supporting plate on which the piezoelectric film and first and second piezoelectric driving electrodes are mounted.

14. The semiconductor device according to claim 13, wherein the first beam portion includes first and second wirings which are formed on the supporting plate and respectively connected to the first and second piezoelectric driving electrodes, and the second beam portion includes a third wiring which is formed on the supporting plate and connected to one of the first and second piezoelectric driving electrodes and one of the first and second wirings.

15. The semiconductor device according to claim 14, wherein the supporting plate is formed of a material having compressive internal stress and each of the first, second and third wirings is formed of a material having tensile internal stress.

16. A semiconductor device comprising:
a sheet-form member formed on a substrate, and
a plurality of actuators which drive the sheet-form member in a direction parallel to the surface of the substrate,
wherein each of the plurality of actuators has a first beam portion which is formed to extend in a first direction with one end thereof fixed at the substrate by use of a supporting member and warped by residual stress with the supporting member set as a starting point,
a piezoelectric portion which is connected at one end to the other end of the first beam portion and formed to extend in a second direction intersecting with the first direction and moves parallel to the substrate in the first direction and in a direction opposite to the first direction by application of bias voltage, and
a second beam portion which is connected at one end to the other end of the piezoelectric portion, formed to extend in a direction opposite to the first direction, connected at the other end to one of the first and second electrodes and warped in the same direction as the first beam portion by residual stress.

17. The semiconductor device according to claim 16, further comprising a voltage detection circuit configured to detect voltage induced in each of the piezoelectric portions of the plurality of actuators according to acceleration applied to the sheet-form member.

18. The semiconductor device according to claim 17, wherein the voltage detection circuit detects accelerations in first and second directions based on a difference piezoelectrically induced charge of the piezoelectric portions.

19. The semiconductor device according to claim 16, further comprising a Coriolis force detecting actuator which detects a displacement of the sheet-form member in a direction parallel to the surface of the substrate,
wherein the plurality of actuators apply reference vibrations to the sheetform member.

20. The semiconductor device according to claim 16, further comprising a frame-like member which is arranged to surround the plate-form member and driven in a first direction and in a direction opposite to the first direction by the plurality of actuators and on which the first beam portions of the plurality of actuators are fixed by use of supporting members, and
a plurality of actuators which drive the frame-like member in a second direction intersecting with the first direction and in a direction opposite to the second direction.

* * * * *